US012650460B2

(12) United States Patent
Nandi et al.

(10) Patent No.: US 12,650,460 B2
(45) Date of Patent: Jun. 9, 2026

(54) CALIBRATION FOR ROUTING RESISTANCE INDUCED ERROR

(71) Applicant: TEXAS INSTRUMENTS INCORPORATED, Dallas, TX (US)

(72) Inventors: Gautam Salil Nandi, Bangalore (IN); Rajavelu Thinakaran, Bangalore (IN); Hariharan Srinivasan, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 399 days.

(21) Appl. No.: 18/344,623

(22) Filed: Jun. 29, 2023

(65) Prior Publication Data

US 2024/0310432 A1     Sep. 19, 2024

(30) Foreign Application Priority Data

Mar. 14, 2023   (IN) .............................. 202341016828

(51) Int. Cl.
| | |
|---|---|
| *G01R 31/28* | (2006.01) |
| *G01R 19/18* | (2006.01) |
| *G01R 35/00* | (2006.01) |
| *H03F 3/04* | (2006.01) |

(52) U.S. Cl.
CPC ......... *G01R 31/2834* (2013.01); *G01R 19/18* (2013.01); *G01R 35/005* (2013.01); *H03F 3/04* (2013.01)

(58) Field of Classification Search
CPC .. G01R 31/2834; G01R 19/18; G01R 35/005; G01R 33/0017; H03F 3/04
USPC ...................................................... 324/750.02
See application file for complete search history.

(56) References Cited

U.S. PATENT DOCUMENTS

| | | | | |
|---|---|---|---|---|
| 8,384,400 | B2 * | 2/2013 | Chou ................. | G01R 27/2605 |
| | | | | 324/658 |
| 10,161,977 | B2 * | 12/2018 | Peng ....................... | G01R 27/28 |
| 2004/0164724 | A1 * | 8/2004 | Chow ............. | G01R 31/31924 |
| | | | | 324/759.01 |
| 2007/0294558 | A1 * | 12/2007 | Desai .................... | G06F 1/3203 |
| | | | | 713/340 |
| 2017/0276724 | A1 * | 9/2017 | Tadepalli ........... | G01R 31/2837 |
| 2020/0348740 | A1 * | 11/2020 | Zhang ..................... | H02M 1/08 |

* cited by examiner

*Primary Examiner* — Raul J Rios Russo
(74) *Attorney, Agent, or Firm* — Xianghui Huang; Frank D. Cimino

(57)     ABSTRACT

In some examples, a method of performing measurement of a device under test (DUT) coupled to a connector includes determining a first voltage signal representative of a current of the DUT, the current flowing through the connector. The method also includes determining a second voltage signal representative of a voltage of the DUT, as provided at the connector. The method also includes determining a calibration current according to the first voltage signal. The method also includes modifying measurement of the DUT according to the calibration current.

20 Claims, 5 Drawing Sheets

500

502 — DETERMINE A FIRST VOLTAGE SIGNAL REPRESENTATIVE OF A CURRENT OF THE DUT, THE CURRENT FLOWING THROUGH THE CONNECTOR

504 — DETERMINE A SECOND VOLTAGE SIGNAL REPRESENTATIVE OF A VOLTAGE OF THE DUT, AS PROVIDED AT THE CONNECTOR

506 — DETERMINE A CALIBRATION CURRENT ACCORDING TO THE FIRST VOLTAGE SIGNAL

508 — MODIFY MEASUREMENT OF THE DUT ACCORDING TO THE CALIBRATION CURRENT

CALIBRATION FOR ROUTING RESISTANCE INDUCED ERROR

CROSS-REFERENCE TO RELATED APPLICATIONS

The present application claims priority to India Provisional Patent Application No. 202341016828, which was filed Mar. 14, 2023, is titled "On-Chip Calibration Technique For Routing Resistance Induced Error In Force Voltage Mode Of A PMU," and is hereby incorporated herein by reference in its entirety.

BACKGROUND

A parametric measurement unit (PMU) is a form of automatic test equipment (ATE). In some operational modes, the PMU provides a voltage at an output pin that is coupled to a terminal of a device under test (DUT). The PMU provides the voltage as a forced voltage to measure a response of the DUT in the presence of that voltage. The voltage may be referred to as a forced voltage. A value present at the terminal of the DUT may be measured by the PMU.

SUMMARY

In some examples, an apparatus includes a current sense circuit, a voltage amplifier, a tunable transconductance amplifier, and a voltage sense circuit. The current sense circuit has an output terminal. The voltage amplifier has a negative input terminal coupled to the output terminal of the current sense circuit. The tunable transconductance amplifier has an input terminal and an output terminal. The input terminal of the tunable transconductance amplifier is coupled to the output terminal of the current sense circuit. The voltage sense circuit has a first signal input terminal, a second signal input terminal, a third input terminal, and an output terminal. The third input terminal of the voltage sense circuit is coupled to the output terminal of the tunable transconductance amplifier.

In some examples, an apparatus includes a current sense circuit, a voltage amplifier, a voltage sense circuit, and a tunable transconductance amplifier. The current sense circuit is configured to measure a current of a DUT to provide a first signal having a voltage representative of the current of the DUT. The voltage amplifier is coupled to the current sense circuit and configured to provide a second signal to the DUT based on a third signal and a fourth signal, wherein the second signal is a result of differential amplification between the third signal and the first signal. The voltage sense circuit is configured to measure a voltage of the DUT at a connector to provide the fourth signal. The tunable transconductance amplifier is coupled to the current sense circuit and the voltage sense circuit. The transconductance amplifier is configured to provide a fifth signal to the voltage sense circuit as a calibration signal. The tunable transconductance amplifier determines the fifth signal according to the first signal and a tuning code.

In some examples, a method of performing measurement of a DUT coupled to a connector includes determining a first voltage signal representative of a current of the DUT, the current flowing through the connector. The method also includes determining a second voltage signal representative of a voltage of the DUT, as provided at the connector. The method also includes determining a calibration current according to the first voltage signal. The method also includes modifying measurement of the DUT according to the calibration current.

DETAILED DESCRIPTION

Figure 1:
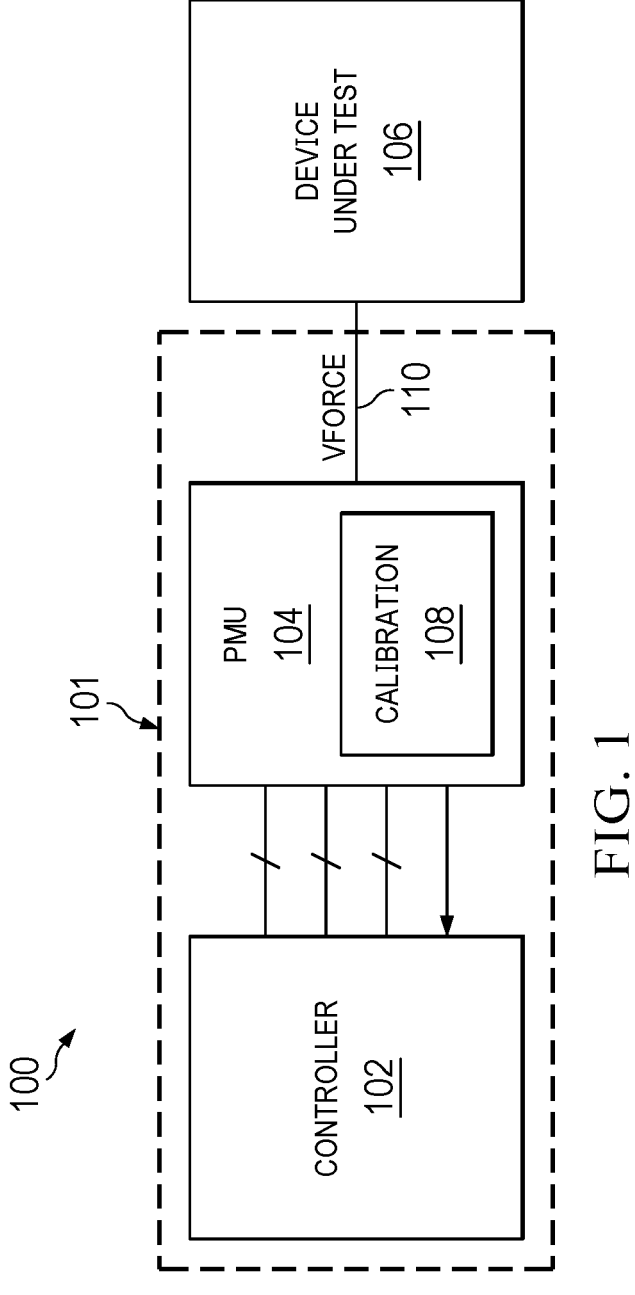
FIG. 1 is a block diagram of an example of a system.

As described above, a PMU provides a forced voltage (VFORCE) at a first pin that is coupled to a terminal of a DUT. The forced voltage is, for example, a stimuli for the DUT. To measure a response of the DUT to the forced voltage, the PMU includes sensing circuitry coupled to the terminal of the DUT. In some implementations, the PMU includes a second pin at which the PMU couples to the terminal of the DUT in a star-connected arrangement. The circuitry for providing the force voltage to the DUT and the sensing circuitry may collectively be referred to as a channel of the PMU, where the PMU may have multiple channels that may couple to separate respective DUTs. Such an implementation of the PMU that includes separate pins for providing the forced voltage and performing sensing may increase an amount of space consumed by one channel of the PMU, limiting a number of channels that may be provided in a single PMU. To increase the number of channels that may be included in the PMU, the forced voltage circuitry and the sensing circuitry may be shorted together in the PMU and may couple at a single pin to the DUT. However, such a single-pin implementation may present challenges, such as parasitic routing resistance within the PMU affecting accuracy of sensing performed by the sensing circuitry. Some solutions May exist for mitigating these challenges, such as a software-based calibration, but such a solution may be high latency and may quickly grow in complexity as a channel count of the PMU increases.

Examples of this description include a hardware-based calibration of a PMU. In some examples, the calibration compensates for parasitic routing resistance within the PMU, mitigating the effect of the parasitic routing resistance on measurement values obtained via sensing circuitry of the PMU. In some examples, a calibration current (ICAL) is determined based on a measured current of the DUT (IDUT). ICAL may be determined to have a value proportional to the parasitic routing resistance. For example, current sensing circuitry of the PMU measures IDUT and provides a voltage (VCS) having a value indicative of IDUT. A transconductance amplifier receives VCS and provides ICAL based on a value of VCS and a transconductance (Gm) of the transconductance amplifier. In an example, Gm is determined based on the parasitic routing resistance. In an example, the transconductance amplifier provides ICAL to voltage sensing circuitry of the PMU, causing the voltage sensing circuitry to mitigate effects of the parasitic routing resistance on a voltage signal (VVS) provided by the voltage sensing circuitry. In another example, the transconductance amplifier provides ICAL to an amplifier or other circuit of the PMU to modify the forced voltage, thereby mitigating effects of the parasitic routing resistance on VVS. In this way, the transconductance amplifier is tunable based on a value of the parasitic routing resistance to have a transconductance that is proportional to the parasitic routing resistance. This tunable nature may enable the transconductance amplifier to provide ICAL having a value determined to counteract, mitigate, or otherwise compensate for effects of the parasitic routing resistance on operation of the PMU, such as in providing VVS. In some examples, the hardware-based approach of this disclosure provides substantially real-time mitigation of effects of the parasitic routing resistance on operation of the PMU, performing compensation or calibration with less latency than software-based approaches. Further, the hardware-based approach of this disclosure also facilitates shorting of the sensing circuitry and the forced voltage circuitry in the PMU, reducing a physical size of a channel of the PMU and enabling an increased channel density in the PMU.

FIG. 1 is a block diagram of an example of a system 100. In an example, the system 100 includes an ATE 101 that includes a controller 102 and PMU 104. The PMU 104 includes a calibration circuit 108. The system 100 also includes a DUT 106, to which the PMU 104 couples via a connector 110. In some examples, the connector 110 is a wire or other conductor that is run between a terminal of the PMU 104 to a terminal of the DUT 106 to couple the DUT 106 to the PMU 104. In some examples, the system 100 is representative of a testing environment for testing of the DUT 106 by the ATE 101.

In an example, the controller 102 is coupled to the PMU 104, which includes the calibration circuit 108. The PMU 104 is coupled via the connector 110 to the DUT 106. In some examples, the controller 102 includes multiple couplings to the PMU 104, such as to provide multiple signals to the PMU 104 and receive one or more signals from the PMU 104. For example, the controller 102 provides a digital signal to the PMU 104 to cause the PMU 104 to provide VFORCE to the DUT 106. The PMU 104 further measures a voltage of the DUT 106 (VDUT). In a theoretical, or nominal, example, VFORCE is approximately equal to VDUT. However, in implementation VDUT varies from VFORCE based on the parasitic routing resistance. Thus, in some examples, VDUT is approximately equal to VFORCE minus IDUT*ROUT, where ROUT is a parasitic resistance of the connector 110. The variation in VDUT from VFORCE caused by the parasitic routing resistance may affect accuracy of VVS, determined by the PMU 104 as described above. To mitigate the effects of the parasitic routing resistance on the value of VDUT, and therefore the value of VVS and operation of the PMU 104 or ATE 101, the calibration circuit 108 provides ICAL to compensate for the effects of the parasitic routing resistance on VDUT and VVS. For example, the calibration circuit 108 receives a signal indicative of IDUT (e.g., VCS) and provides ICAL proportional to IDUT and ROUT. In this way, the calibration circuit 108 causes the PMU 104 to see VDUT as approximately equal to VFORCE, despite the presence of ROUT.

Figure 2:
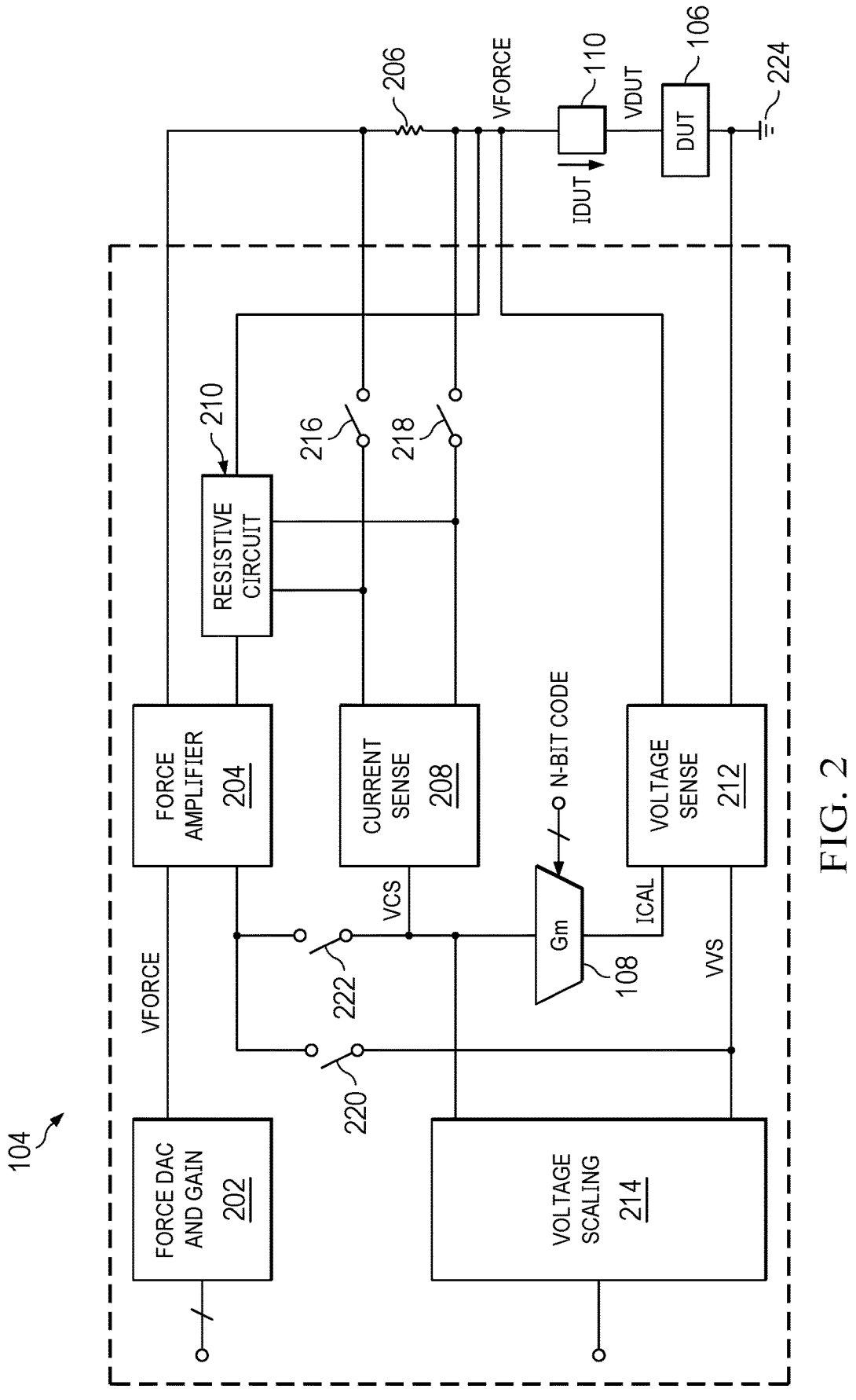
FIG. 2 is a block diagram of an example of a PMU.

FIG. 2 is a block diagram of an example of the PMU 104. In an example, the PMU 104 includes a force digital-to-analog converter (DAC) and gain circuit 202, a force amplifier circuit 204, a resistor 206, a current sense circuit 208, a resistive circuit 210, a voltage sense circuit 212, and a voltage scaling circuit 214. The PMU 104 also includes switches 216, 218, 220, and 222. As shown in FIG. 2, the calibration circuit 108 may be a transconductance amplifier. In some examples, the resistor 206 is not a component of the PMU 104 but instead couples to the PMU 104.

In an example architecture of the PMU 104, the gain circuit 202 includes an input and an output. In some examples, the input is coupled to the controller 102 and receives a digital signal useful in providing VFORCE at a programmed value. In some examples, the gain circuit 202 includes a second input. The second input may be coupled to the controller 102 or any other suitable source, such as for receiving a second digital value useful in providing VFORCE at the programmed value. The second digital value may be an offset value, a value for programming a gain factor of the gain circuit 202, or any other suitable value useful in an architecture of the gain circuit 202. The force amplifier circuit 204 has first and second inputs, as well as first and second outputs. The first input of the force amplifier circuit 204 is coupled to the output of the gain circuit 202 to receive VFORCE. The resistor 206 has a first terminal coupled to the first output of the force amplifier circuit 204 and a second terminal coupled to the connector 110, such as via a terminal of the PMU 104.

The current sense circuit 208 has first and second inputs, and an output. The resistive circuit 210 has first and second inputs and first and second outputs. The first input of the resistive circuit 210 is coupled to the second output of the force amplifier circuit 204. The second input of the resistive circuit 210 is coupled to the connector 110, such as via a terminal of the PMU 104. The first output of the resistive circuit 210 is coupled to the first input of the current sense circuit 208. The second output of the resistive circuit 210 is coupled to the second input of the current sense circuit 208. The calibration circuit 108 includes first and second inputs, and an output. In some examples, the first input of the calibration circuit 108 is coupled to the controller 102 and receives a digital signal specifying a transconductance of the calibration circuit 108. The second input of the calibration circuit 108 is coupled to the output of the current sense circuit 208.

In some examples, the voltage sense circuit 212 has first, second, and third inputs, and an output. The first input of the voltage sense circuit 212 is coupled to the connector 110, such as via a terminal of the PMU 104. The second input of the voltage sense circuit 212 is coupled, in some examples, to a ground terminal 224 at which a ground voltage potential is provided. The third input of the voltage sense circuit 212 is coupled to the output of the calibration circuit 108. The voltage scaling circuit 214 has first and second inputs, and at least a first output. In some examples, the voltage scaling circuit 214 has additional outputs, such as at least a second output. The first input of the voltage scaling circuit 214 is coupled to the output of the current sense circuit 208. The second input of the voltage scaling circuit 214 is coupled to the output of the voltage sense circuit 212. The first output of the voltage scaling circuit 214, in some examples, is coupled to the controller 102. The switch 216 has a first terminal coupled to the first terminal of the resistor 206 and a second terminal coupled to the first input of the current sense circuit 208. The switch 218 has a first terminal coupled to the second terminal of the resistor 206 and a second terminal coupled to the second input of the current sense circuit 208. The switch 220 has a first terminal coupled to the output of the voltage sense circuit 212 and a second terminal coupled to the second input of the force amplifier circuit 204. The switch 222 has a first terminal coupled to the output of the current sense circuit 208 and a second terminal coupled to the second input of the force amplifier circuit 204. Although not shown in FIG. 2, in some examples, the switches 216, 218, 220, and 222 each have a respective control terminal which may be coupled to any suitable circuit, component, or device to receive control signals for controlling a state of the respective switch. In some examples, the control terminals are coupled to the controller 102.

In an example of operation of the PMU 104, a digital signal is received at the first input of the gain circuit 202. In some examples, the digital signal is received from the controller 102. The gain circuit 202 provides VFORCE having a value determined based on the received digital signal. The force amplifier circuit 204 receives VFORCE and VVS and modifies a value of VFORCE through negative feedback to cause VDUT to approximately equal VFORCE. In examples in which IDUT is comparatively large, such as about 100 milliamps (mA) or larger, IDUT is measured by the current sense circuit 208 to form VCS based on a voltage measured across the resistor 206. In examples in which IDUT is comparatively small, such as less than about 100 mA, IDUT is measured by the current sense circuit 208 to form VCS based on a voltage measured across the resistive circuit 210. The voltage sense circuit 212 measures a value of VDUT at the connector 110 to provide VVS. In some examples, the voltage scaling circuit 214 attenuates VVS and VCS to place the attenuated signals in a voltage domain sampleable by a low-voltage (e.g., about 5 V) analog-to-digital converter (ADC) (not shown) and, in some examples, offsets the attenuated signals to align the attenuated signals with an input voltage range of the ADC.

As described above, in some examples, VDUT varies from VFORCE based on a parasitic resistance of the connector 110 (e.g., ROUT). This variation may adversely affect operation of the PMU 104, such as by affecting the accuracy of VVS. To compensate for the variation, the calibration circuit 108 receives VCS from the current sense circuit 208 and receives a digital calibration signal, such as from controller 102. In some examples, the digital calibration signal has a value proportional to ROUT. Based on VCS and the digital calibration signal, the calibration circuit 108 provides ICAL. For example, the calibration circuit 108 scales (e.g., multiplies) VCS based on the digital calibration signal to determine a value of ICAL. In some examples, ROUT is based on a length of the connector 110. For example, ROUT may be determined based on a datasheet for the connector 110, measurement of resistance of the connector 110, calculation based on a resistivity of the connector 110 and a measured length of the connector 110, or any other suitable method of resistance determination. In other examples, an approximate value for ROUT may be selected and the PMU 104 may fine tune ICAL to cause VDUT to approximately equal VFORCE.

In some examples, as shown in FIG. 2, the calibration circuit 108 provides ICAL to the voltage sense circuit 212 to mitigate the variation in VDUT from VFORCE based on ROUT. In other examples, although not shown in FIG. 2, the output of the calibration circuit 108 is not coupled to the voltage sense circuit 212. Instead, the output of the calibration circuit 108 is coupled to the first input of the force amplifier circuit 204. In such an example, the calibration circuit 108 provides ICAL to the force amplifier circuit 204 to mitigate the variation in VDUT from VFORCE based on ROUT.

Figure 3:
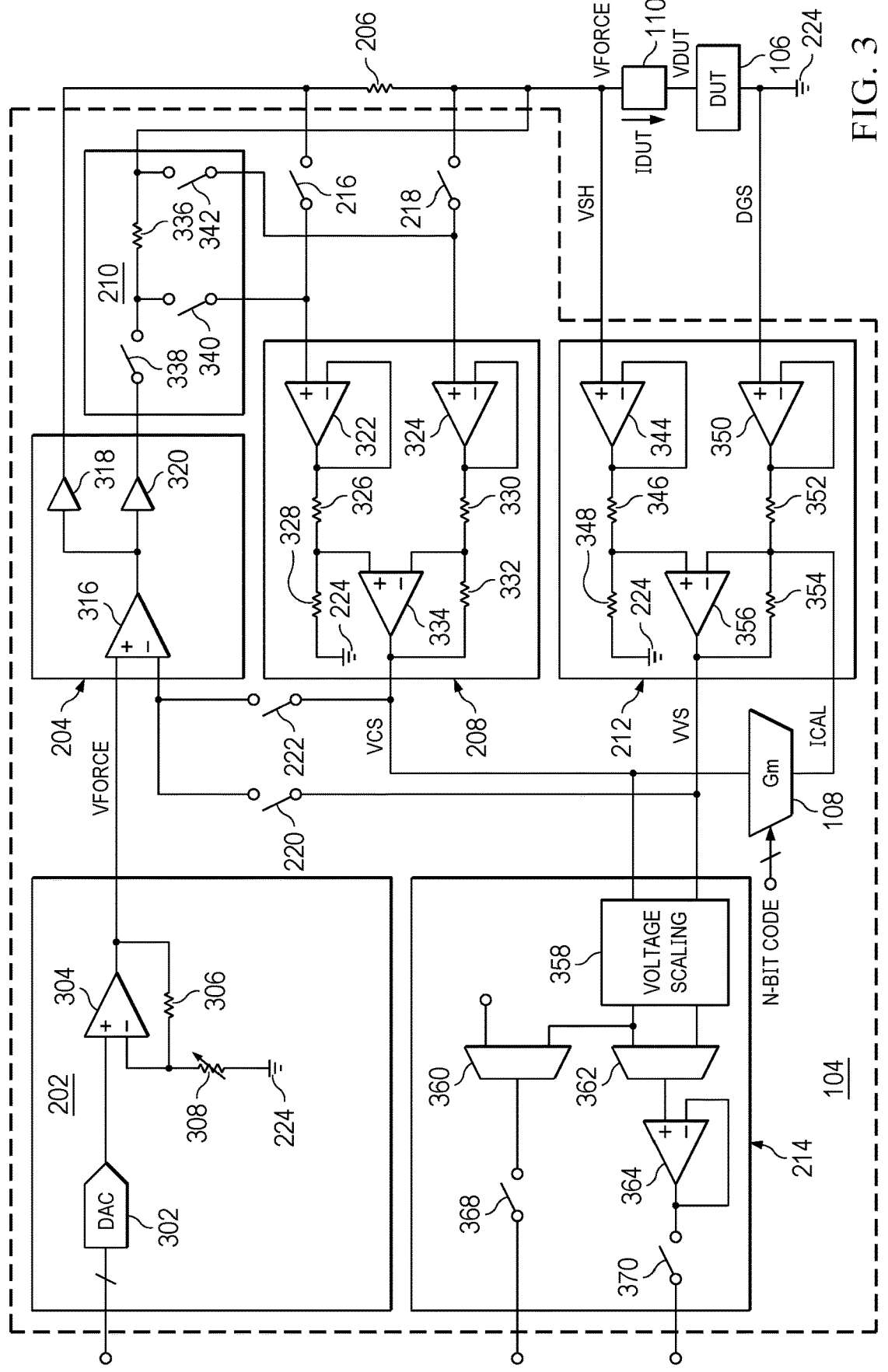
FIG. 3 is a schematic diagram of an example of a PMU.

FIG. 3 is a schematic diagram of an example of the PMU 104. In some examples, the PMU 104 of FIG. 3 is representative of the PMU 104 of FIG. 2, shown in greater detail. Accordingly, at least description of the PMU 104 made with respect to FIG. 2 may be omitted from the description of FIG. 3, or may be referred to by reference to FIG. 2.

In an example, the gain circuit 202 includes a force DAC 302, an amplifier 304, a resistor 306, and a resistor 308. The force DAC 302 has an input which may be the first input of the gain circuit 202 and is coupled to the controller 102, and an output. The amplifier 304 has first and second inputs, and an output, which may be the output of the gain circuit 202. The first input of the amplifier 304 is coupled to the output of the force DAC 302. The resistor 306 has a first terminal coupled to the output of the amplifier 304 and a second terminal coupled to the second input of the amplifier 304. The resistor 308 has a first terminal coupled to the second input of the amplifier 304 and has a second terminal coupled to the ground terminal 224. In some examples, the resistor 308 has a set or specified resistance value. In other examples, the resistor 308 has a tunable, programmable, or otherwise adjustable resistance value. In such examples, the resistor 308 includes a control terminal (not shown) coupled to any suitable source for receiving a control signal for specifying s resistance value of the resistor 308.

In an example, the force amplifier circuit 204 includes an amplifier 316, a buffer 318, and a buffer 320. Although not shown in FIG. 3, in some examples the force amplifier circuit 204 includes additional components, such as clamp or limiting circuitry to limit a voltage or current value of a signal provided by the amplifier 316. The amplifier 316 has first and second inputs, and an output. The first input of the amplifier 316, which may be the first input of the force amplifier circuit 204, is coupled to the output of the amplifier 304. The second input of the amplifier 316, which May be the second input of the force amplifier circuit 204, is coupled to the respective second terminals of the switches 220, 222. The buffer 318 has an input and an output. The input of the buffer 318 is coupled to the output of the amplifier 316. The output of the buffer 318, which may be the first output of the force amplifier circuit 204, is coupled to the first terminal of the resistor 206. The buffer 320 has an input and an output. The input of the buffer 320 is coupled to the output of the amplifier 316. The output of the buffer 320 may be the second output of the force amplifier circuit 204.

In an example, the current sense circuit 208 includes an amplifier 322, and amplifier 324, resistors 326, 328, 330, and 332, and an amplifier 334. In an example, the amplifier 322 has first and second inputs, and an output. The first input of the amplifier 322, which may be the first input of the current sense circuit 208, is coupled to the second terminal of the switch 216 and to the first output of the resistive circuit 210. The second input of the amplifier 322 is coupled to the output of the amplifier 322. In an example, the amplifier 324 has first and second inputs, and an output. The first input of the amplifier 324, which may be the second input of the current sense circuit 208, is coupled to the second terminal of the switch 218 and to the second output of the resistive circuit 210. The second input of the amplifier 324 is coupled to the output of the amplifier 324. The resistor 326 has first and second terminals, in which the first terminal of the resistor 326 is coupled to the output of the amplifier 322. The resistor 328 has first and second terminals, in which the first terminal of the resistor 326 is coupled to the second terminal of the resistor 326, and the second terminal of the resistor 328 is coupled to the ground terminal 224. The resistor 330 has first and second terminals, in which the first terminal of the resistor 330 is coupled to the output of the amplifier 324. The resistor 332 has first and second terminals, in which the first terminal of the resistor 332 is coupled to the second terminal of the resistor 330. The amplifier 334 has first and second inputs, and an output. The first input of the amplifier 334 is coupled to the second terminal of the resistor 326, the second input of the amplifier 334 is coupled to the second terminal of the resistor 330, and the output of the amplifier 334, which may be the output of the current sense circuit 208, is coupled to the input of the calibration circuit 108, the first terminal of the switch 222, and the first input of the voltage scaling circuit 214. In an example, the second terminal of the resistor 332 is coupled to the output of the amplifier 334. In some examples of the current sense circuit 208, a resistance of the resistor 328 is approximately five times a resistance of the resistor 326, and a resistance of the resistor 332 is approximately five times a resistance of the resistor 330. Thus, a gain of the current sense amplifier 208 is approximately equal to five. However, in other examples, the resistance of the resistor 328 is approximately N times a resistance of the resistor 326, and a resistance of the resistor 332 is approximately N times a resistance of the resistor 330 to provide a gain of the current sense amplifier 208 that is approximately equal to N.

In an example, the resistive circuit 210 includes a resistor 336 and switches 338, 340, and 342. The resistor 336 has first and second terminals, in which the second terminal of the resistor 336 may be the second input of the resistive circuit 210 and is coupled to the connector 110, such as via a terminal of the PMU 104. The switch 338 has first and second terminals, in which the first terminal of the switch 338, which may be the first input of the resistive circuit 210, is coupled to the output of the buffer 320, and the second terminal of the switch 338 is coupled to the first terminal of the resistor 336. The switch 340 has first and second terminals, in which the first terminal of the switch 340 is coupled to the first terminal of the resistor 336, and the second terminal of the switch 340, which may be the first output of the resistive circuit 210, is coupled to the first input of the amplifier 322. The switch 342 has first and second terminals, in which the first terminal of the switch 342 is coupled to the second terminal of the resistor 336, and the second terminal of the switch 342, which may be the second output of the resistive circuit 210, is coupled to the first input of the amplifier 324. Although not shown in FIG. 3, in some examples, the switches 338, 340, 342 each have a respective control terminal which may be coupled to any suitable circuit, component, or device to receive control signals for controlling a state of the respective switch. In some examples, the control terminals are coupled to the controller 102.

In an example, the voltage sense circuit 212 includes an amplifier 344, an amplifier 350, resistors 346, 348, 352, and 354, and an amplifier 356. In an example, the amplifier 344 has first and second inputs, and an output. The first input of the amplifier 344, which may be the first input of the voltage sense circuit 212, is coupled to the connector 110, such as via a terminal of the PMU 104. The second input of the amplifier 344 is coupled to the output of the amplifier 344. The resistor 346 has first and second terminals, in which the first terminal of the resistor 346 is coupled to the output of the amplifier 344. The resistor 348 has first and second terminals, in which the first terminal of the resistor 348 is coupled to the second terminal of the resistor 346, and the second terminal of the resistor 348 is coupled to the ground terminal 224. In an example, the amplifier 350 has first and second inputs, and an output. The first input of the amplifier 350, which may be the second input of the voltage sense circuit 212, is coupled to the ground terminal 224. The second input of the amplifier 350 is coupled to the output of the amplifier 350. The resistor 352 has first and second terminals, in which the first terminal of the resistor 352 is coupled to the output of the amplifier 350. The resistor 354 has first and second terminals, in which the first terminal of the resistor 354 is coupled to the second terminal of the resistor 352. The amplifier 356 has first and second inputs, and an output. The first input of the amplifier 356 is coupled to the second terminal of the resistor 346, the second input of the amplifier 356 is coupled to the second terminal of the resistor 352, and the output of the amplifier 356, which may be the output of the voltage sense circuit 212, is coupled to the first terminal of the switch 220 and the second input of the voltage scaling circuit 214. In an example, the second terminal of the resistor 354 is coupled to the output of the amplifier 356. In some examples of the voltage sense circuit 212, a resistance of the resistor 348 is approximately the same as a resistance of the resistor 346, and a resistance of the resistor 354 is approximately the same as a resistance of the resistor 352. Thus, a gain of the voltage sense circuit 212 is approximately equal to one. However, in other examples, the resistance of the resistor 348 is approximately M times a resistance of the resistor 346, and a resistance of the resistor 354 is approximately M times a resistance of the resistor 352 to provide a gain of the voltage sense circuit 212 that is approximately equal to M. In some examples, the output of the calibration circuit 108 is coupled to the second input of the amplifier 356, such as to mitigate variation of VDUT from VFORCE, as described above.

In an example, the voltage scaling circuit 214 includes a scaling circuit 358, a multiplexer 360, a multiplexer 362, an amplifier 364, and switches 368 and 370. In an example, the scaling circuit 358 has first and second inputs, and first and second outputs. The first input of the scaling circuit 358, which may be the first input of the voltage scaling circuit 214, is coupled to the output of the current sense circuit 208. The second input of the scaling circuit 358, which may be the second input of the voltage scaling circuit 214, is coupled to the output of the voltage sense circuit 212. The multiplexer 360 has first and second inputs, and an output. In various examples, the first input of the multiplexer 360 may receive any suitable signal from any suitable source, node, terminal, or component of the PMU 104, such as to provide a signal from the PMU 104 for monitoring or testing by the controller 102. The second input of the multiplexer 360 is coupled to the first output of the scaling circuit 358. The output of the multiplexer 360 is coupled to a first terminal of the switch 368 that has a second terminal, which may be a first output of the voltage scaling circuit 214, coupled to the controller 102. The multiplexer 362 has first and second inputs, and an output. The first input of the multiplexer 362 is coupled to the first output of the scaling circuit 358. The second input of the multiplexer 362 is coupled to the second output of the scaling circuit 358. The output of the multiplexer 362 is coupled to a first input of the amplifier 364. The amplifier 364 has a second input, and has an output. The second input of the amplifier 364 is coupled to the output of the amplifier 364. The output of the amplifier 264 is coupled to a first terminal of the switch 370 that has a second terminal, which may be a second output of the voltage scaling circuit 214, coupled to the controller 102. Although not shown in FIG. 3, in some examples the switches 368, 370 each have a respective control terminal which may be coupled to any suitable circuit, component, or device to receive control signals for controlling a state of the respective switch. In some examples, the control terminals are coupled to the controller 102. Similarly, although not shown in FIG. 3, in some examples, the multiplexers 360, 362 each have a respective select or control terminal which may be coupled to any suitable circuit, component, or device to receive control signals for selecting an input of a respective multiplexer for output by that respective multiplexer. In some examples, the select or control terminals are coupled to the controller 102.

In an example of operation of the PMU 104 of FIG. 3, the force DAC 302 receives a digital signal and provides a voltage signal having a value determined according to the digital signal. The voltage provided by the force DAC 302 is amplified by the amplifier 304 to form VFORCE. In an example, a gain ratio of the amplifier 304 is determined according to a ratio of resistance of the resistor 306 to resistance of the resistor 308. The amplifier 304 may lack sufficient drive strength for driving the DUT 106. As such, the amplifier 316 receives VFORCE at its first input and implements negative feedback based on VVS to cause VDUT to approximately equal VFORCE. In an example, by opening the switches 338, 340, and 342, and closing the switches 216, 218, the current sense circuit 208 determines and provides VCS indicating a value of IDUT flowing through the resistor 206. In another example, by closing the switches 338, 340, and 342, and opening the switches 216, 218, the current sense circuit 208 determines and provides VCS indicating a value of IDUT flowing through the resistor 336. The calibration circuit 108 receives VCS and provides ICAL based on a value of VCS and the tuning code. In some examples, ICAL is approximately equal to a decimal value of the tuning code multiplied by VCS.

As described above herein, in a theoretical, or nominal, example, VFORCE is approximately equal to VDUT. However, in implementation VDUT may be approximately equal to VFORCE–IDUT*ROUT, as described above. VCS is approximately equal to IDUT*Rsense*N, where Rsense is a resistance of the resistor 206 or the resistor 336 through which the current sense circuit 208 is determining IDUT. ICAL is approximately equal to Gm*VCS, thus by substitution ICAL=Gm*(IDUT*Rsense*N), wherein Gm is the decimal value of the tuning code received by the calibration circuit 108. VVS is approximately equal to (VSH–DGS)–ICAL*R, where R is a resistance of the resistor 354. The feedback loop formed between the force amplifier circuit 204 and the voltage sense circuit 212 causes the force amplifier circuit 204 to provide VFORCE having a value approximately equal to VVS, thus by substitution VFORCE=(VSH–DGS)–ICAL*R. By further substitution, VDUT=(VSH–DGS)–IDUT*ROUT, VDUT=VFORCE+ICAL*R–IDUT*ROUT, and VDUT=VFORCE+IDUT*(Gm*5*Rsense*R–ROUT). By determining and providing the tuning code such that Gm=ROUT/(N*Rsense*R), VDUT becomes approximately equal to VFORCE. In some examples, the controller 102 generates the tuning code as K*2^X, in which X is a number of bits of the digital code and K is determined according to a resistance of the connector divided by a maximum connector resistance value. In an example, the maximum connector resistance is the maximum value of ROUT that can be calibrated. As such, the calibration current may be determined proportional to a parasitic resistance of the connector and proportional to the first voltage signal.

Figure 4:
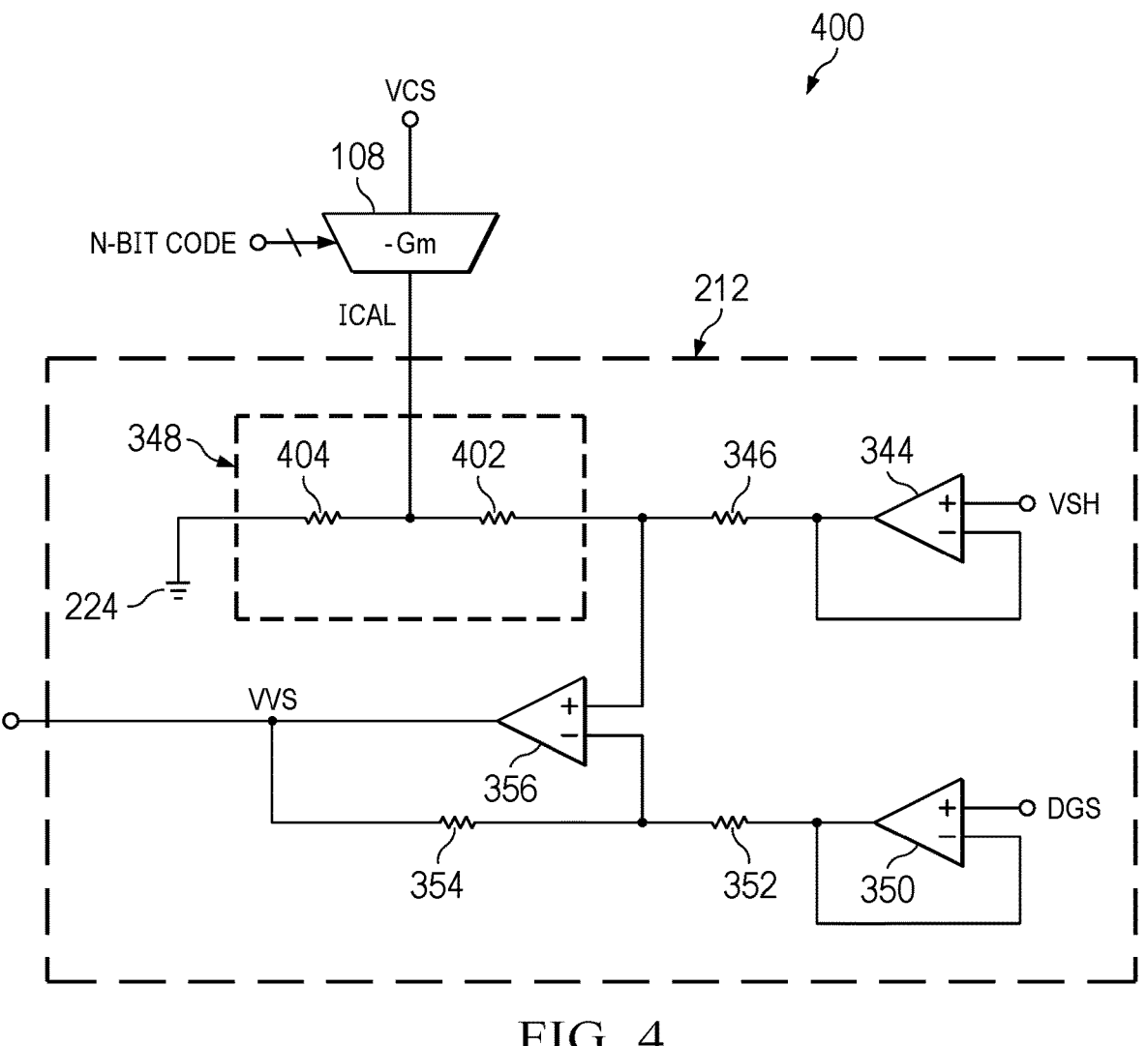
FIG. 4 is a schematic diagram of an example of a voltage sense circuit.

FIG. 4 is a schematic diagram of an example of the voltage sense circuit 212. Accordingly, at least some description of the voltage sense circuit 212 made with respect to FIG. 3 may be omitted from the description of FIG. 4, or may be referred to by reference to FIG. 3. As described above with respect to FIG. 3, in some examples, the output of the calibration circuit 108 couples to a virtual ground of the voltage sense circuit 212 (e.g., the second input of the amplifier 356). However, under certain operating conditions such an arrangement may present challenges.

For example, VVS may swing rail-to-rail, or vary within an operating voltage range (e.g., input voltage minus ground voltage potential) of the PMU 104. This may cause the calibration circuit 108 to be exposed to a large variation in output common-mode voltage, which may introduce error in a value of ICAL, such as resulting from the calibration circuit 108 having a finite output impedance. In some examples, a leakage current may flow from the calibration circuit 108. A resulting leakage error of the calibration circuit 108 may be proportional to a ratio of the leakage current to a step size of ICAL.

Thus, in other examples, the output of the calibration circuit 108 couples to an internal node of the voltage sense circuit 212. For example, the resistor 348 may be divided into a resistor 402 and a resistor 404. The resistor 402 has first and second terminals, in which the first terminal of the resistor 402 is coupled to the second terminal of the resistor 346. The resistor 404 has first and second terminals, in which the first terminal of the resistor 404 is coupled to the second terminal of the resistor 402 and the second terminal of the resistor 404 is coupled to the ground terminal 224. The output of the calibration circuit 108 couples to the second terminal of the resistor 402. In such an example, a polarity of the calibration circuit may be inverted. In some examples, a resistance of the resistor 402 is approximately ¾ of the resistance of the resistor 346, and a resistance of the resistor 404 is approximately ¼ of the resistance of the resistor 346.

By coupling the calibration circuit 108 to the voltage sense circuit 212 as shown in FIG. 4, at least some of the challenges created in coupling the calibration circuit 108 to the voltage sense circuit 212 at a virtual ground of the voltage sense circuit 212, as shown in FIG. 3, may be mitigated. For example, variation in output common-mode voltage of the calibration circuit 108 of FIG. 4 may be reduced to approximately ¼ that of the calibration circuit 108 coupled as shown in FIG. 3. Similarly, an ICAL step size of the calibration circuit 108 of FIG. 4 may be approximately 4 times greater than that of the calibration circuit 108 coupled as shown in FIG. 3, reducing the ratio of the leakage current to the step size of ICAL.

Figure 5:
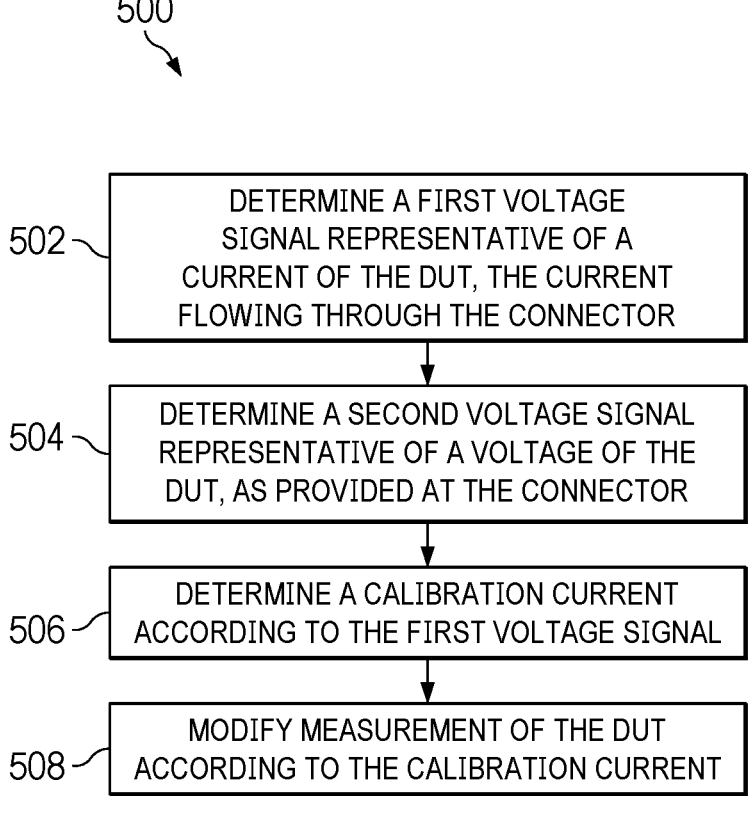
FIG. 5 is a flow diagram of an example method.

FIG. 5 is a flow diagram of an example method 500. In some examples, the method 500 is a method of performing a measurement of a DUT, such as by an ATE and is implemented, at least in part, by the PMU 104 and/or the controller 102.

At operation 502, a first voltage signal representative of a current of a DUT is determined. In some examples, the current is flowing through a connector or terminal of a PMU, such as the PMU 104. In some examples, the first voltage signal is determined by a circuit such as the current sense circuit 208. In some examples, the current flows through the connector responsive to the PMU providing a forced voltage at the connector. In some examples, the forced voltage is provided by the gain circuit 202 and/or the force amplifier circuit 204.

At operation 504, a second voltage signal representative of a voltage of the DUT is determined. In some examples, the voltage is provided at the connector or terminal of the PMU. In a theoretical, or nominal example, the voltage of the DUT is approximately equal to the forced voltage. However, in implementation, the voltage of the DUT varies from the forced voltage based on the parasitic routing resistance of the PMU, such as a parasitic resistance of the connector or terminal of the PMU.

At operation 506, a calibration current is determined according to the first voltage signal. For example, the first voltage signal may be scaled based on a tuning code. The tuning code is, for example, determined having a value proportional to the parasitic routing resistance of the PMU, such as the parasitic resistance of the connector or terminal of the PMU. In some examples, the calibration current is determined and provided by a calibration circuit, such as the calibration circuit 108, which may be a transconductance amplifier. In such an example, the tuning code may tune or program a transconductance of the transconductance amplifier. In some examples, the tuning code is a digital code determined to have a value of K*2$^X$, in which X is a number of bits of the digital code and K is determined according to a resistance of the connector divided by a maximum connector resistance value. As such, the calibration current may be determined proportional to a parasitic resistance of the connector and proportional to the first voltage signal. In an example, the maximum connector resistance is the maximum value of ROUT that can be calibrated.

At operation 508, measurement of the DUT is modified according to the calibration current. In some examples, modification of the measurement of the DUT is performed by modifying determination of the second voltage signal according to the calibration current, such as described above with respect to the voltage sense circuit 212 of FIG. 3 or FIG. 4. In other examples, modification of the measurement of the DUT is performed by modifying a value of the forced voltage according to the calibration current, such as by providing the calibration current through a series resistance to the first terminal of the amplifier 316.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. An apparatus, comprising:
a current sense circuit having an output terminal;
a voltage amplifier having a negative input terminal coupled to the output terminal of the current sense circuit;
a tunable transconductance amplifier having an input terminal and an output terminal, the input terminal of the tunable transconductance amplifier coupled to the output terminal of the current sense circuit; and
a voltage sense circuit having a first signal input terminal, a second signal input terminal, a third input terminal, and an output terminal, wherein the third input terminal of the voltage sense circuit is coupled to the output terminal of the tunable transconductance amplifier.

2. The apparatus of claim 1, wherein the voltage sense circuit includes:
a first amplifier having a first input terminal, a second input terminal, and an output terminal, in which the first input terminal of the first amplifier is the first signal input terminal of the voltage sense circuit, and the second input terminal of the first amplifier is coupled to the output terminal of the first amplifier;
a first resistor having first and second terminals, the first terminal of the first resistor coupled to the output terminal of the first amplifier;
a second resistor having first and second terminals, the first terminal of the second resistor coupled to the second terminal of the first resistor, and the second terminal of the second resistor coupled to a ground terminal;
a second amplifier having a first input terminal, a second input terminal, and an output terminal, in which the first input terminal of the second amplifier is the second signal input terminal of the voltage sense circuit, and the second input terminal of the second amplifier is coupled to the output terminal of the second amplifier;

a third resistor having first and second terminals, the first terminal of the third resistor coupled to the output terminal of the second amplifier;

a fourth resistor having first and second terminals, the first terminal of the fourth resistor coupled to the second terminal of the third resistor; and a third amplifier having a first input terminal, a second input terminal, and an output terminal, in which the first input terminal of the third amplifier is coupled to the second terminal of the first resistor, the second input terminal of the third amplifier is the third input terminal and is coupled to the second terminal of the third resistor and to the output terminal of the tunable transconductance amplifier, and the output terminal of the third amplifier is coupled to the second terminal of the fourth resistor and is the output terminal of the voltage sense circuit.

3. The apparatus of claim 1, wherein the voltage sense circuit includes:

a first amplifier having a first input terminal, a second input terminal, and an output terminal, in which the first input terminal of the first amplifier is the first signal input terminal of the voltage sense circuit, and the second input terminal of the first amplifier is coupled to the output terminal of the first amplifier;

a first resistor having first and second terminals, the first terminal of the first resistor coupled to the output terminal of the first amplifier;

a second resistor having first and second terminals, the first terminal of the second resistor coupled to the second terminal of the first resistor;

a third resistor having first and second terminals, the first terminal of the third resistor coupled to the second terminal of the second resistor, and the second terminal of the third resistor coupled to a ground terminal, wherein the first terminal of the third resistor is the third input terminal and is coupled to the output terminal of the tunable transconductance amplifier;

a second amplifier having a first input terminal, a second input terminal, and an output terminal, in which the first input terminal of the second amplifier is the second signal input terminal of the voltage sense circuit, and the second input terminal of the second amplifier is coupled to the output terminal of the second amplifier;

a fourth resistor having first and second terminals, the first terminal of the fourth resistor coupled to the output terminal of the second amplifier;

a fifth resistor having first and second terminals, the first terminal of the fifth resistor coupled to the second terminal of the fourth resistor; and a third amplifier having a first input terminal, a second input terminal, and an output terminal, wherein the first input terminal of the third amplifier is coupled to the second terminal of the first resistor, the second input terminal of the third amplifier is coupled to the second terminal of the fourth resistor, and the output terminal of the third amplifier is coupled to the second terminal of the fifth resistor and is the output terminal of the voltage sense circuit.

4. The apparatus of claim 1, further comprising:

a first switch having first and second terminals, the second terminal of the first switch coupled to the output terminal of the current sense circuit; and a second switch having first and second terminals, the second terminal of the second switch coupled to the output terminal of the voltage sense circuit, wherein the voltage amplifier includes:

an amplifier having a first input terminal, a second input terminal, and an output terminal, in which the second input terminal of the amplifier is coupled to the first terminal of the first switch and to the first terminal of the second switch;

a first buffer having an input terminal and an output terminal, the input terminal of the first buffer coupled to the output terminal of the amplifier, and the output terminal coupled to a first output pin of the apparatus; and a second buffer having an input terminal and an output terminal, the input terminal of the second buffer coupled to the output terminal of the amplifier.

5. The apparatus of claim 4, wherein the apparatus further comprises:

a controllable voltage source having a first control input terminal, a second control input terminal, and an output terminal, in which the output terminal of the controllable voltage source is coupled to the first input terminal of the amplifier;

a resistor having first and second terminals, wherein the second terminal of the resistor is coupled to a second output pin of the apparatus;

a third switch having first and second terminals, the first terminal of the third switch coupled to the output terminal of the second buffer, and the second terminal of the third switch coupled to the first terminal of the resistor;

a fourth switch having first and second terminals, the first terminal of the fourth switch coupled to the first terminal of the resistor; and a fifth switch having first and second terminals, the first terminal of the fifth switch coupled to the second terminal of the resistor.

6. The apparatus of claim 5, wherein the controllable voltage source includes:

a first digital-to-analog converter (DAC) having an input terminal and an output terminal, in which the input terminal of the first DAC is coupled to a first input pin of the apparatus;

a second amplifier having first and second input terminals, and an output terminal, in which the first input terminal of the second amplifier is coupled to the output terminal of the first DAC, and the output terminal of the second amplifier is coupled to the first input terminal of the amplifier;

a second resistor having first and second terminals, the first terminal of the second resistor coupled to the output terminal of the second amplifier, and the second terminal of the second resistor coupled to the second input terminal of the second amplifier;

an adjustable value resistor having first and second terminals, the first terminal of the adjustable value resistor coupled to the second input terminal of the second amplifier;

a multi-pole switch having first, second, and third terminals, in which the first terminal of the multi-pole switch is coupled to the second terminal of the adjustable value resistor, and the second terminal of the multi-pole switch is coupled to a ground terminal;

a second DAC having an input terminal and an output terminal, in which the input terminal of the second DAC is the second control input terminal of the controllable voltage source; and a buffer having a buffer input and a buffer output, the buffer input coupled to the output terminal of the second DAC, and the buffer output coupled to the third terminal of the multi-pole switch.

7. The apparatus of claim 6, wherein the tunable transconductance amplifier has a tuning input terminal, and the apparatus further comprises a controller having first, second, and third output terminals, in which the first output terminal of the controller is coupled to the tuning input terminal of the tunable transconductance amplifier, the second output terminal of the controller is coupled to the input terminal of the first DAC, and the third output terminal of the controller is coupled to the input terminal of the second DAC.

8. The apparatus of claim 5, wherein the current sense circuit includes:

a sixth switch having first and second terminals, in which the second terminal of the sixth switch is coupled to an input pin of the apparatus;

a seventh switch having first and second terminals, in which the second terminal of the seventh switch is coupled to a second input pin of the apparatus;

a first amplifier having a first input terminal, a second input terminal, and an output terminal, in which the first input terminal of the first amplifier is coupled to the second terminal of the fourth switch and to the first terminal of the sixth switch, and the second input terminal of the first amplifier is coupled to the output terminal of the first amplifier;

a third resistor having first and second terminals, the first terminal of the third resistor coupled to the output terminal of the first amplifier;

a fourth resistor having first and second terminals, the first terminal of the fourth resistor coupled to the second terminal of the third resistor, and the second terminal of the fourth resistor coupled to a ground terminal;

a second amplifier having a first input terminal, a second input terminal, and an output terminal, in which the first input terminal of the second amplifier is coupled to the second terminal of the fifth switch and to the first terminal of the seventh switch; and the second input terminal of the second amplifier is coupled to the output terminal of the second amplifier;

a fifth resistor having first and second terminals, the first terminal of the fifth resistor coupled to the output terminal of the second amplifier;

a sixth resistor having first and second terminals, the first terminal of the sixth resistor coupled to the second terminal of the fifth resistor; and a third amplifier having a first input terminal, a second input terminal, and an output terminal, in which the first input terminal of the third amplifier is coupled to the second terminal of the third resistor, the second input terminal of the third amplifier is coupled to the second terminal of the fifth resistor, and the output terminal of the third amplifier is coupled to the second terminal of the sixth resistor and is the output terminal of the current sense circuit.

9. An apparatus, comprising:

a current sense circuit configured to measure a current of a device under test (DUT) to provide a first signal having a voltage representative of the current of the DUT;

a voltage amplifier coupled to the current sense circuit and configured to provide a second signal to the DUT based on a third signal and a fourth signal, wherein the second signal is a result of differential amplification between the third signal and the first signal;

a voltage sense circuit configured to measure a voltage of the DUT at a connector to provide the fourth signal; and a tunable transconductance amplifier coupled to the current sense circuit and the voltage sense circuit, the tunable transconductance amplifier configured to provide a fifth signal to the voltage sense circuit as a calibration signal, wherein the tunable transconductance amplifier determines the fifth signal according to the first signal and a tuning code.

10. The apparatus of claim 9, wherein the tuning code is determined responsive to a resistance of the connector.

11. The apparatus of claim 10, wherein the tuning code has a value determined according to $K*2^X$, in which X is a number of bits of the tuning code and K is determined according to the resistance of the connector divided by a maximum connector resistance value.

12. The apparatus of claim 9, wherein the apparatus further comprises a digital-to-analog converter configured to receive a digital code and provide a seventh signal having a value determined according to the digital code; and an amplifier configured to amplify the seventh signal to form the third signal.

13. The apparatus of claim 12, further comprising a controller, wherein the controller is configured to provide the tuning code and the digital code.

14. A method of performing measurement of a device under test (DUT) coupled to a connector, the method comprising:

measuring, with a first sense circuit coupled to the DUT by the connector, a first voltage signal representative of a current of the DUT, the current flowing through the connector;

measuring, with a second sense circuit coupled to the DUT by the connector, a second voltage signal representative of a voltage across the DUT, as provided at the connector;

generating, with a calibration circuit, a calibration current signal according to the first voltage signal; and modifying, with the second sense circuit or an amplifier circuit coupled to the DUT by the connector, the second voltage signal according to the calibration current signal.

15. The method of claim 14, the calibration circuit comprising a tunable transconductance amplifier, the tunable transconductance amplifier being tunable according to a digital code, the digital code determined responsive to a resistance of the connector.

16. The method of claim 15, wherein the digital code is determined to have a value of $K*2^{*X}$, in which X is a number of bits of the digital code and K is determined according to the resistance of the connector divided by a maximum connector resistance value.

17. The method of claim 14, further comprising providing, with the amplifier circuit, a forced voltage at the connector.

18. The method of claim 17, further comprising modifying, with the amplifier circuit, the second voltage signal by modifying a value of the forced voltage according to the calibration current signal.

19. The method of claim 14, further comprising modifying, with the second sense circuit, the second voltage signal according to the calibration current signal.

20. The method of claim 14, further comprising determining the calibration current signal proportional to a parasitic resistance of the connector and proportional to the first voltage signal.

* * * * *